(12) United States Patent
Chao et al.

(10) Patent No.: US 12,413,237 B2
(45) Date of Patent: Sep. 9, 2025

(54) CHARGE-INJECTION SAR ADC FOR CORRECTING FULL SCALE PVT VARIATION

(71) Applicants: Yuan-Ju Chao, Cupertino, CA (US); John H Yu, San Jose, CA (US); Krishnamurthy Subramanian, Saratoga, CA (US)

(72) Inventors: Yuan-Ju Chao, Cupertino, CA (US); John H Yu, San Jose, CA (US); Krishnamurthy Subramanian, Saratoga, CA (US)

(73) Assignee: PIMIC, Inc., Cupertino, CA (US)

( * ) Notice: Subject to any disclaimer, the term of this patent is extended or adjusted under 35 U.S.C. 154(b) by 156 days.

(21) Appl. No.: 18/407,613

(22) Filed: Jan. 9, 2024

(65) Prior Publication Data

US 2024/0235565 A1    Jul. 11, 2024

Related U.S. Application Data

(60) Provisional application No. 63/438,040, filed on Jan. 10, 2023.

(51) Int. Cl.
*H03M 1/06*      (2006.01)
*H03M 1/18*      (2006.01)
*H03M 1/46*      (2006.01)

(52) U.S. Cl.
CPC ............ *H03M 1/0604* (2013.01); *H03M 1/18* (2013.01); *H03M 1/462* (2013.01); *H03M 1/466* (2013.01)

(58) Field of Classification Search
CPC ........ H03M 1/06; H03M 1/466; H03M 1/462; H03M 1/18
See application file for complete search history.

(56) References Cited

U.S. PATENT DOCUMENTS 10,594,333 B1 *    3/2020    Choo .................... H03M 1/466

\* cited by examiner

*Primary Examiner* — Joseph J Lauture
(74) *Attorney, Agent, or Firm* — Robert Schuler

(57) ABSTRACT

A charge-injection SAR ADC device has a modified charge-injection cell (CIC), and a complementary to absolute temperature (CTAT) circuit for generating a bias voltage. The CIC and CTAT circuits cooperate to correct for process, voltage, and temperature (PVT) variation that affect SAR ADC input full scale. The CIC has been modified to have transistors that are in a cascoded relationship with transistors operating to maintain a reservoir of charge. The CTAT circuit is designed to substantially replicate the CIC, and it tracks the CIC operation to correct variations in transistor threshold voltage due to variations in PVT.

16 Claims, 5 Drawing Sheets

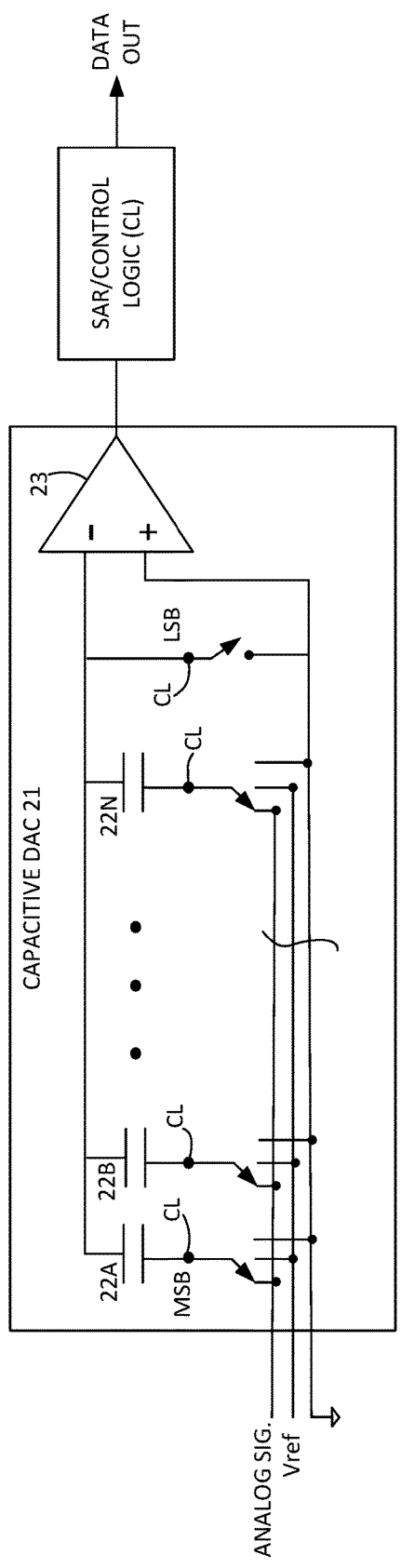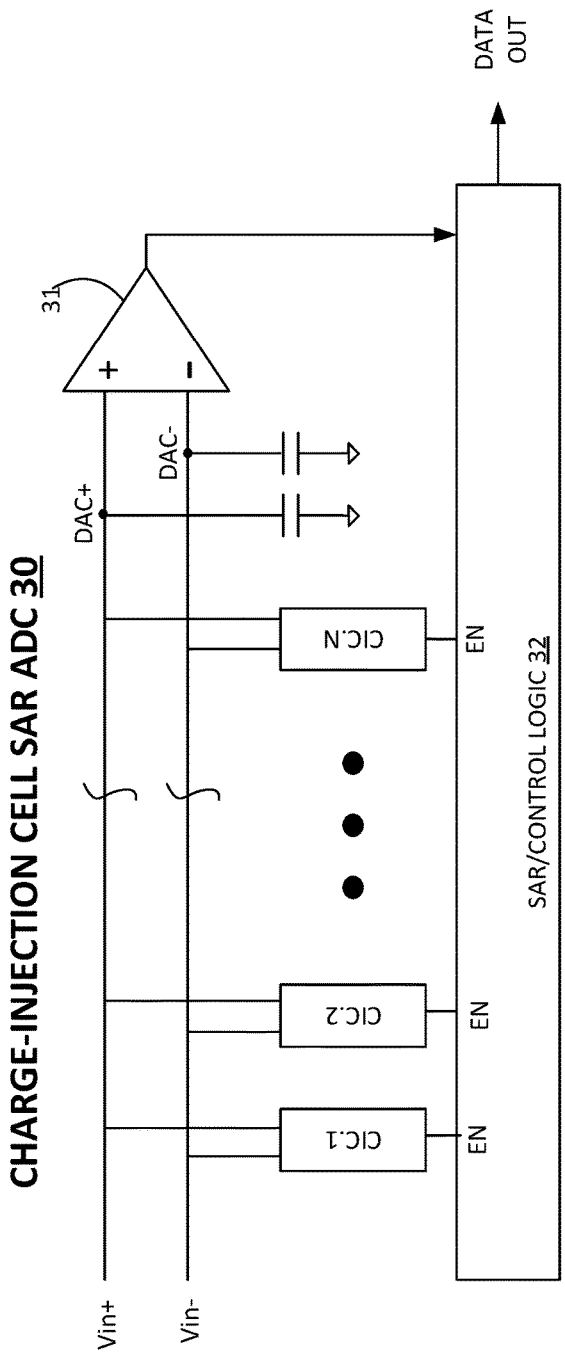
FIG. 2
FIG. 3

CHARGE-INJECTION SAR ADC FOR CORRECTING FULL SCALE PVT VARIATION

1. FIELD OF THE INVENTION

The present disclosure relates generally to the area of analog-to-digital converters, and specifically to charge-injection cell-based SAR ADC design.

2. BACKGROUND

Various types of analog-to-digital converters (ADC) are employed in electronic devices to convert analog signal information to a format that is suitable for storage in computer memory, or that is suitable to be operated on by a digital signal processor. One application for an ADC can be an audio communication system (i.e., audio or video conferencing system) that comprises a microphone for capturing environmental sound (i.e., voice signals) that are then converted for processing by the system in order to remove certain unwanted information from the signal, such as background noise or acoustic echo. ADCs can also be incorporated into CAP-RAM memory circuits used for in-memory computing applications. In this case the ADC can be connected to one or more CAP-RAM macros and operate to receive a charge maintained on capacitors comprising the CAP-RAM. The output of each ADC can be sent to digital periphery functionality which operates to shift and add the partial sums sampled by the ADC.

One type of ADC that has come into use is a Successive Approximation Register (SAR) ADC. FIG. 1 is a diagram illustrating the functional elements comprising a SAR-ADC 10. The SAR-ADC 10 in FIG. 1, has a relatively small form factor, is energy efficient, and can perform the analog-to-digital conversion process very rapidly. The SAR-ADC 10 is comprised of sample and hold functionality 11, a comparator 12, a sequential approximate register (SAR) 13 and a DAC 14.

Generally, a SAR-ADC has a capacitive-type DAC element. FIG. 2 is a diagram showing a SAR-ADC 20 having such a capacitive DAC 21. The DAC 21 is comprised of a comparator 23 an array of capacitors labeled 22A-22N, with N being an integer. The DAC can occupy more or less space depending upon the number of bits supported by the DAC design. In operation, an analog signal level is sampled by each capacitor and made available to the comparator 23 under control of the logic (CL). Note, that the SAR-ADC 20 has a reference voltage (Vref) that is employ by the DAC 21 to generate an analog voltage that is proportional to the reference voltage. The accuracy of the DAC output voltage is a function of the accuracy/stability of the Vref. However, incorporating an internal or external voltage reference into the design of a DAC can, depending upon the requirements of an application, take to much device real estate or require to much power to operate.

Certain applications require that the space occupied by a SAR-ADC be relatively small, or at least smaller than that occupied by a SAR ADC comprising a capacitive type DAC. In order to satisfy this requirement, the size of the DAC can be reduced by replacing the capacitor array with charge injection cells (CICs). Such a charge-injection cell SAR-ADC (ci-SAR ADC) is shown with reference to FIG. 3. Each CIC, labeled CIC.1 to CIC.N. comprising the SAR ADC 30 in FIG. 3 can be reused for different steps of a SAR process, which has the effect of reducing the overall size of this type of SAR-ADC.

FIG. 4 is a diagram showing the components comprising one charge injection cell (CIC) 40 comprising the ADC 30 in FIG. 3. The CIC 40 has a capacitive reservoir (CR) and parasitic capacitance (Cp) which can be applied to the DAC(+/−) according to signals from a sequential approximation register (not shown) that control three logic OR gates, G1, G2, and G3.

3. BRIEF DESCRIPTION OF THE DRAWINGS

FIG. 2 is a diagram showing functional elements comprising a SAR-ADC 20.

FIG. 3 is a diagram showing functional elements comprising a Charge-Injection Cell SAR-ADC 30.

4. DETAILED DESCRIPTION

Figure 1:
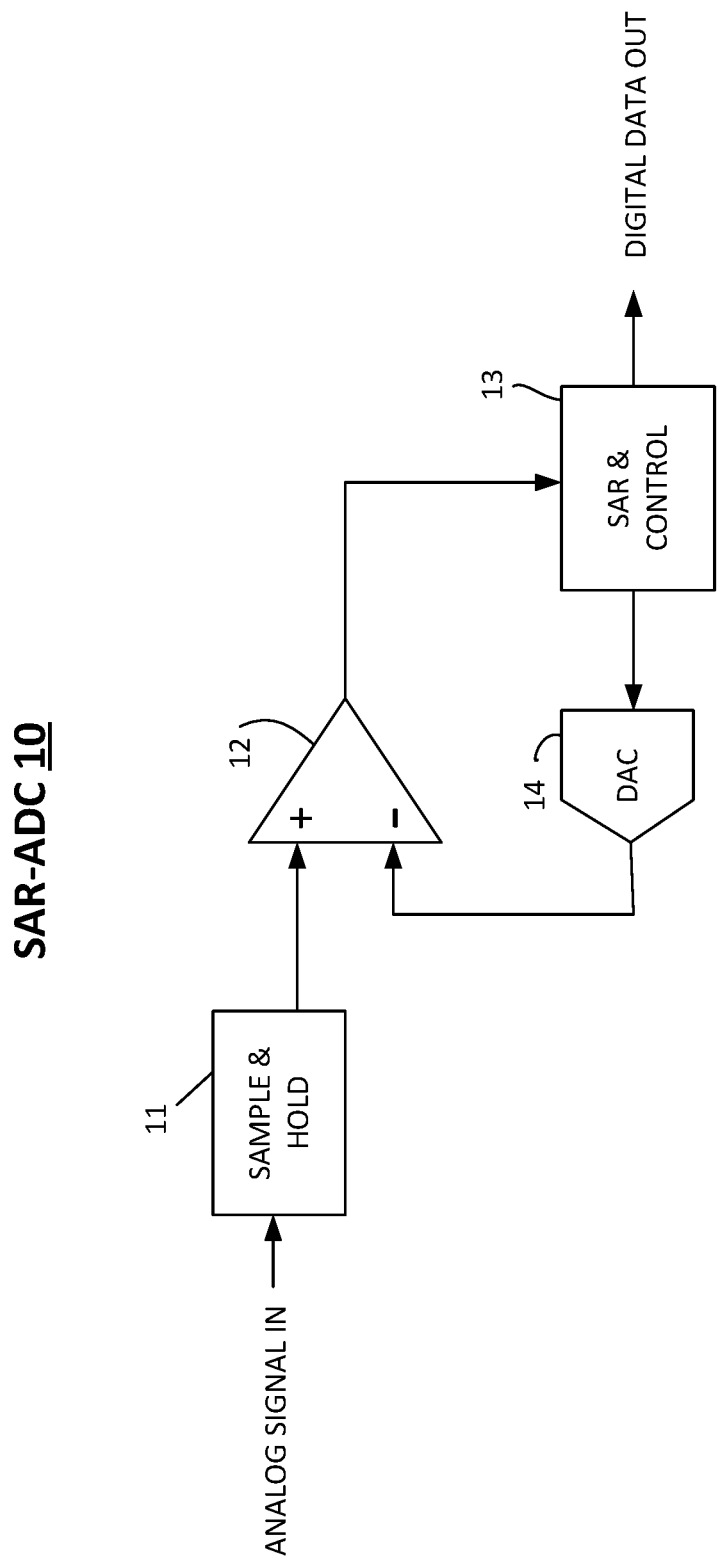
FIG. 1 is a diagram showing functional elements comprising a SAR-ADC 10.
Figure 4:
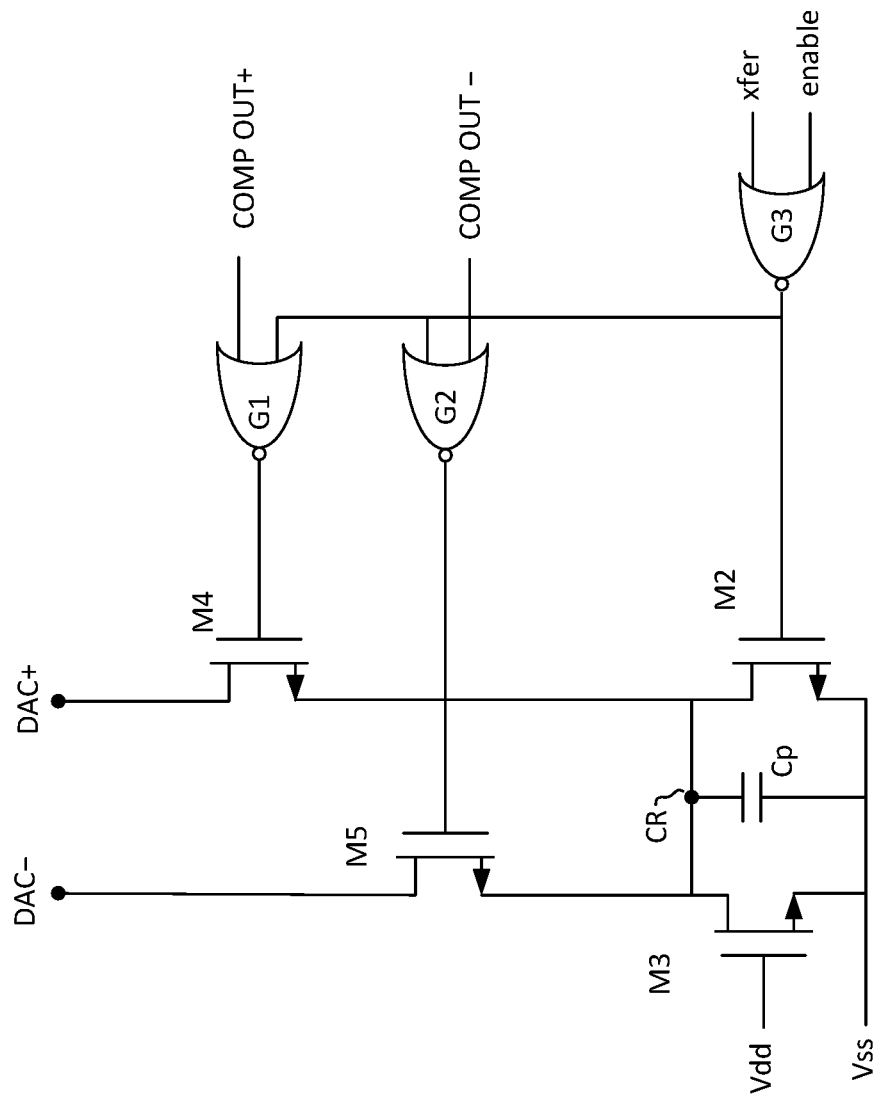
FIG. 4 is a diagram showing elements comprising a Charge-Injection Cell associated with a SAR ADC.

Depending upon variations in the process used to fabricate a ci-SAR ADC, and depending upon variations in a temperature at which a ci-SAR ADC operates (i.e., together referred to generally as ProcesVoltageTemperature or PVT), a ci-SAR input full scale can vary. Further, a charge stored by a ci-SAR ADC typically also is comprised of a parasitic capacitance (Cp) stored at a FET drain terminal comprising a CIC, such as the drain node on FET M4 in FIG. 4. The Cp can also vary depending upon variations in PVT. Variations in ci-SAR input can affect the operation of a DAC and comparator combination associated with the ci-SAR, which can result in a false ADC output, and ultimately denigrate the integrity of information that is being converted.

According to one embodiment, we have mitigated the above problem by modifying a standard charge-injection cell (CIC) to have a cascoded device, which in combination with a novel bias circuit design operates to correct PVT related variations in the ci-SAR ADC input full scale by adjusting the cascoded device gate voltage. This bias circuit tracks and substantially replicates the CIC, and operates to correct variations in the FET threshold voltage (Vt) due to variations in Process, Voltage and Temperature (PVT).

More specifically, a ci-SAR ADC device has circuit elements that operate to generate a PVT corrected voltage used to control the operation of a cascoded device added to a standard CIC. The PVT corrected voltage value is applied to a CIC replica circuit, and the resulting voltage is used to bias a device cascoded with respect to the CIC. Accordingly, the CIC can operate to inject a correct charging current into the DAC.

Figure 5:
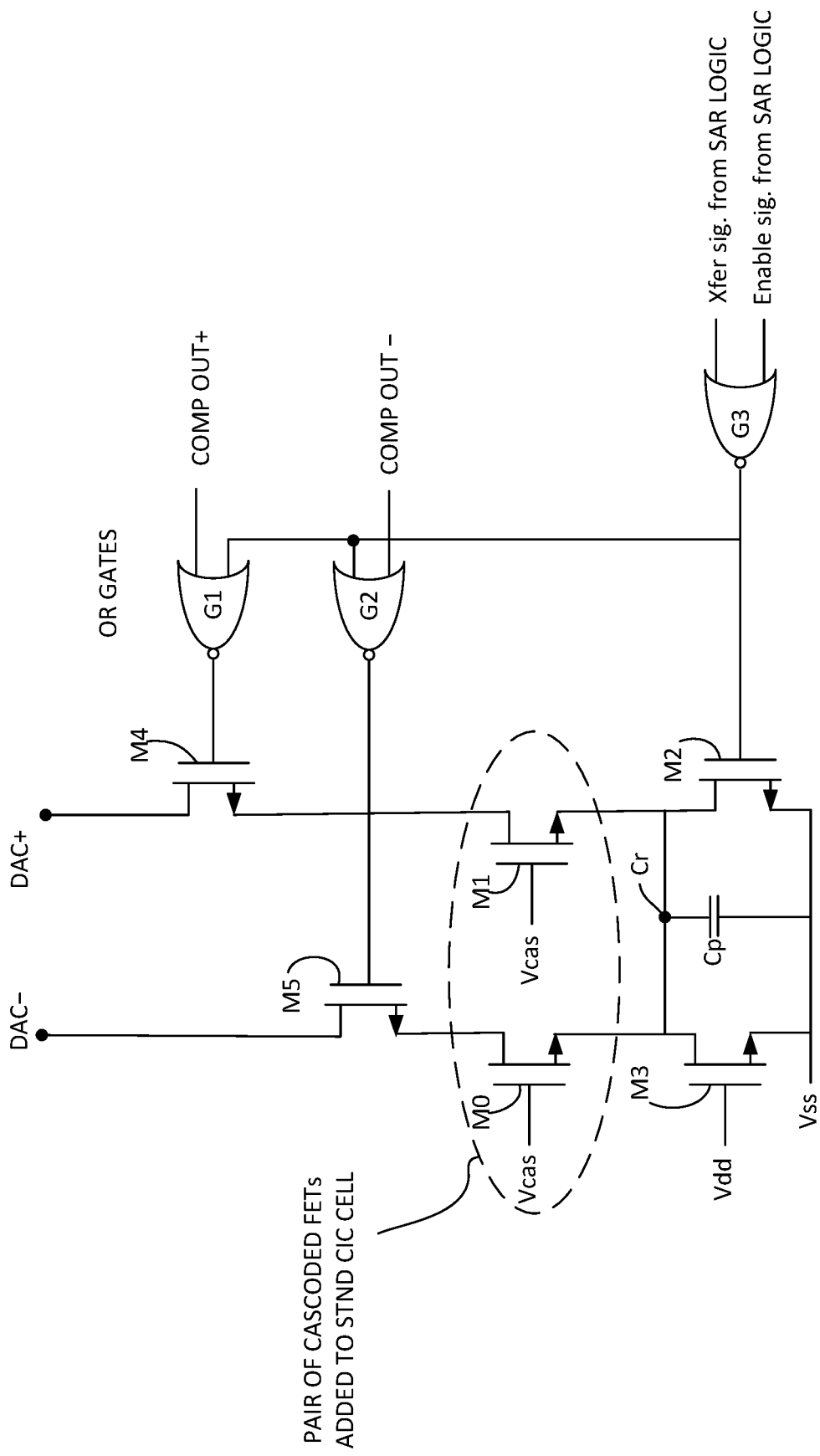
FIG. 5 is a diagram showing elements comprising an embodiment of a Charge-Injection Cell 50.

The above and other embodiments will now be described with reference to the figures, in which FIG. 5 illustrates an embodiment of a CIC 50 having two FETs M0 and M1 cascoded with respect to FETs M3 and M2. A voltage (Vcas) generated by a biasing circuit (described later with reference to FIG. 6), is applied to each of the cascoded FETs M0 and M1, which operate in conjunction with the FETs M3 and M2 to inject an amount of capacitive charge (i.e., corrected current) via the FETs M5 and M4 to a DAC labeled DAC− and DAC+. This capacitive charge is maintained by the CIC 50 in a charge reservoir labeled Cr, and in a parasitic capacitance labeled Cp. In operation the CIC 50 is controlled by a signal generated by the gates G1, G2 and G3, which are in turned controlled by signals received from an ADC comparator (not shown) and SAR logic. More specifically, the amount of charge injected by the CIC 50 is a function of an Xfer/Enable pulse width generated by the gate labeled G3. The longer this gate enables the transfer/injection, the greater the charge that is injected to the DAC. The operation of the comparator and SAR logic will not be described here in any detail, as the design and operation of a CIC type SAR ADC is well known the those skilled in this art.

Continuing to refer to FIG. 5, and as mentioned earlier with reference to FIG. 2, since incorporating a voltage reference (Vref) into a DAC comprising a CIC, or providing an external Vref, either occupies to much device real estate or requires to much power to operate. In light of the above, CICs are typically designed to operate without a Vref. From one perspective, the charge transfer functionality of a CIC has replaced a Vref, which is otherwise used with a DAC. As mentioned above, the amount of charge transferred by a CIC is a function of a predetermined/programmable pulse width of a G3 Xfer/Enable signal, and this pulse width is sensitive to the value of Vdd. As such, the value of Vdd is employed by a CIC as a defacto voltage reference. Unfortunately, the value of Vdd can vary depending upon the temperature at which the FETs operate, and this variation in the value of Vdd can affect the code generated by the ADC. Depending upon the application, occasional errors in code generated by an ADC may be tolerated. However, errors may not be satisfactory for applications that require a high degree of stability/accuracy in an analog signal to digital signal conversion operation. One such application can be the detection of keyword information in a voice signal captured by a microphone. If the digital information used for the detection process (typically by some sort of a neural network) does not accurately represent the analog information captured by the microphone, then the keyword detection process may not arrive at the correct conclusion.

Figure 6:
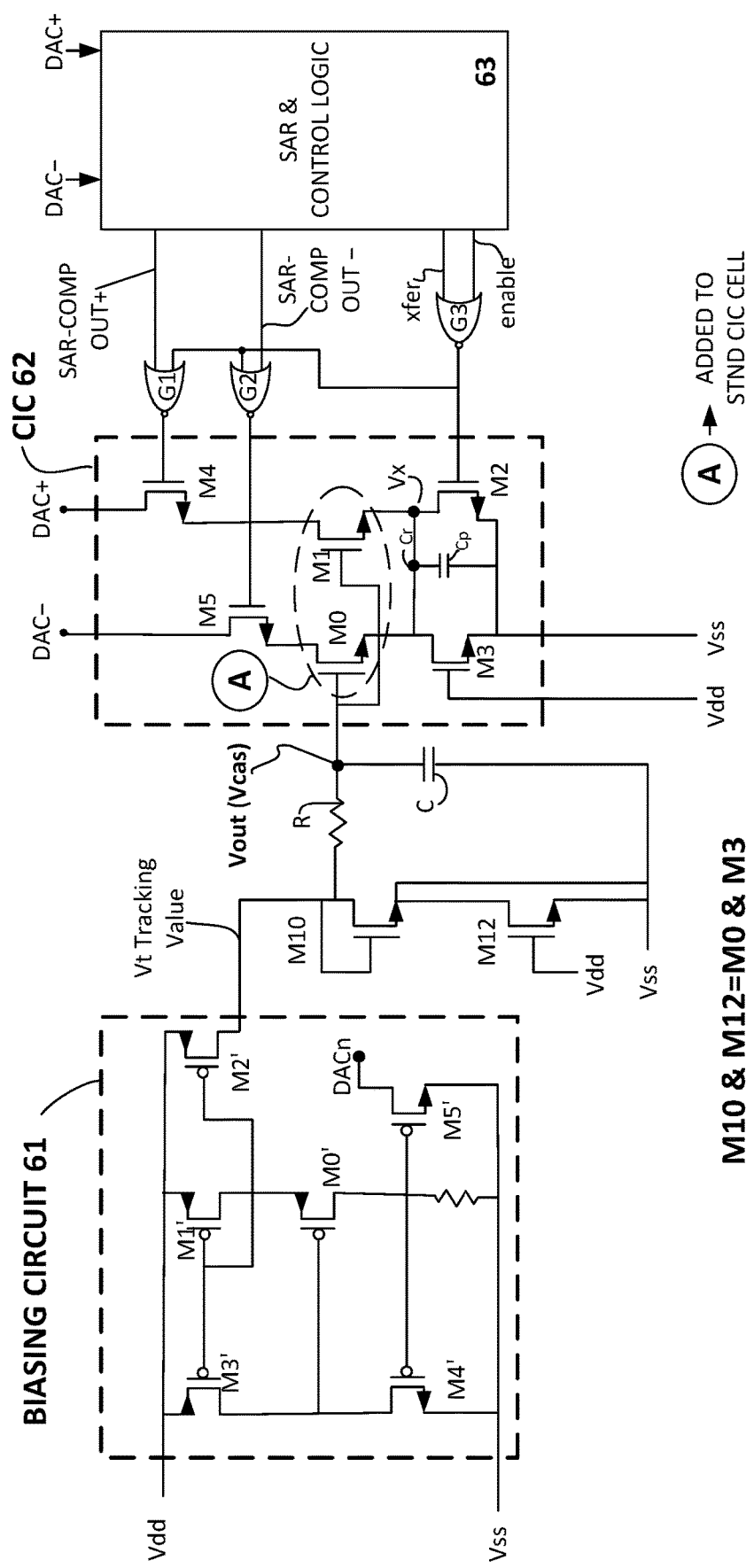
FIG. 6 is a diagram showing functional elements comprising an embodiment of a Charge-Injection Cell SAR ADC 60.

FIG. 6 illustrates the circuit elements comprising a ci-SAR ADC 60 according to an embodiment of the invention. The ADC 60 is comprised of a biasing circuit 61, a CIC 62 controlled by logic gates G1, G2 and G3, and a SAR and control logic 63. The CIC 62 is similar to the CIC 50 in FIG. 5, and in this vein a voltage Vss (and not a Vref) is applied to the source nodes of the FETs M3 and M2. Generally, the FET threshold voltage (Vt) trends lower as the FET operating temperature trends higher. This has the effect of lowering the value of the voltage at the node Vx, which results in the value of the capacitance Cr trending higher. In order to compensate for this, the ADC 60 is designed to have the bias circuit 60 that operates to generate a correcting voltage (Vcas) which is applied to the gates of the cascoded FETs labeled M0 and M1 comprising the CIC 62. Applying the Vcas bias voltage to the cascoded FETs raises or lowers, as necessary, the current through these devices, which has the effect of correcting the stored capacitive charge injected into the DAC.

In FIG. 6, a FET labeled M10 is the same or matches the FETs labeled M0 and M1, and the FET labeled M12 matches the FETs labeled M3 and M3, and this correspondence allows the behavior of M0/M3 to automatically track the M10/M12 behavior. Further, according to this circuit arrangement, the value of Vout (Vcas) changes with respect to PVT which results in the value of Vx changing with respect to PVT.

The biasing circuit 61 is designed to generate a current/ voltage that is complementary to absolute temperature (CTAT), which in this case is the temperature at which the CIC FETs operate. The current/voltage generated by the CTAT circuit has a reciprocal relationship with respect to the temperature at which the CIC operates (i.e, the voltage increases or decreases in value as the temperature decrease or increases respectively). The FETs labeled M1, M2, M3, M4 and M5 in the circuit 61 match (i.e., are the same type of device) M1', M2', M3', M4 and M5 in the CIC 62. Further, the FETs labeled M10 and M12 match FETs M0 and M3, while some of the other FETs may not have a matching relationship.

The forgoing description, for purposes of explanation, used specific nomenclature to provide a thorough understanding of the invention. However, it will be apparent to one skilled in the art that specific details are not required in order to practice the invention. Thus, the forgoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A power, voltage, temperature (PVT) variation corrected charge-injection SAR ADC, comprising:
   a charge-injection circuit (CIC) having matching first (M0) and second (M1) transistors that are in a cascode relationship with respect to matching third (M3) and a fourth (M2) transistors which are controlled to maintain and to inject charge to a DAC comprising the ADC; and
   a biasing circuit that generates a voltage that is complementary to a temperature at which transistors comprising the CIC operate, the biasing voltage being applied to gate nodes of the first and second transistors and to a drain node of a fifth transistor (M10) that matches the first and second cascoded transistors, wherein the fifth transistor drain node is connected to the gate nodes of the first and second transistors.

2. The charge-injection SAR ADC of claim 1, wherein the first, second and fifth transistors cooperate to reduce variation in the charge applied to the DAC due to variation in PVT.

3. The charge-injection SAR ADC of claim 1, wherein the biasing voltage corrects for variations in the charge applied to the DAC.

4. The charge-injection SAR ADC of claim 3, wherein variation in charge applied to the DAC is the result of variation in any one or more of a SAR ADC fabrication process, a transistor threshold voltage and an operating temperature.

5. The charge-injection SAR ADC of claim 1, wherein the charge injected to the ADC is comprised of a reservoir of capacitive charge and a parasitic capacitance.

6. The charge-injection SAR ADC of claim 1, wherein the biasing circuit is a replica of the CIC.

7. The charge-injection SAR ADC of claim 1, wherein the biasing circuit generates voltage that is complementary to absolute temperature (CTAT).

8. The biasing circuit of claim 7, wherein the voltage generated increases or decreases in value as a temperature of the CIC transistors respectively decrease or increase.

9. The biasing circuit of claim 7, wherein the CTAT voltage is equivalent to a reference voltage.

10. The charge-injection SAR ADC of claim 1, further comprising an R/C filter connected to an output of the biasing circuit and connected to each of a gate node comprising the cascoded transistors.

11. A method for correcting a variation in an amount of capacitive charge injected to a SAR ADC, comprising:
generating a bias voltage that is applied to both a charge-injection circuit (CIC) and to a replica of the charge-injection circuit to correct the amount of capacitive charge injected to a DAC comprising the SAR ADC, wherein the CIC and the replica cooperated to reduce variations in the charge injected.

12. The method of claim 11, wherein the bias voltage generated is complementary to a temperature at which transistors comprising the CIC operate.

13. The method of claim 11, wherein bias voltage generated has a reciprocal relationship to the temperature at which the CIC operates.

14. The method of claim 11, wherein the variation in the charge applied to the DAC as the result of variation in process, voltage and temperature is corrected by applying the bias voltage to both the CIC and CIC replica.

15. The method of claim 11, wherein the bias voltage is complementary to an absolute temperature at which the CIC operates.

16. The method of claim 15, wherein the temperature at which the CIC operates is substantially equal to the temperature at which one or more transistors comprising the CIC operate.

* * * * *